United States Patent
Proye et al.

(10) Patent No.: US 10,740,670 B2
(45) Date of Patent: Aug. 11, 2020

(54) METHODS OF FABRICATION OF CHIP CARDS AND OF CHIP CARD ANTENNA SUPPORTS

(71) Applicant: LINXENS HOLDING, Mantes la Jolie (FR)

(72) Inventors: Cyril Proye, Magnanville (FR); Valerie Mousque, Limay (FR); Christophe Paul, Courcelles sur Seine (FR)

(73) Assignee: Linxens Holding, Mantes la Jolie (FR)

( * ) Notice: Subject to any disclaimer, the term of this patent is extended or adjusted under 35 U.S.C. 154(b) by 0 days.

(21) Appl. No.: 16/085,042

(22) PCT Filed: Mar. 30, 2017

(86) PCT No.: PCT/FR2017/050735
§ 371 (c)(1),
(2) Date: Sep. 14, 2018

(87) PCT Pub. No.: WO2017/168100
PCT Pub. Date: Oct. 5, 2017

(65) Prior Publication Data
US 2020/0034679 A1    Jan. 30, 2020

(30) Foreign Application Priority Data
Mar. 30, 2016   (FR) ..................... 16 52762

(51) Int. Cl.
*G06K 19/077*    (2006.01)
*H01L 21/48*    (2006.01)
(Continued)

(52) U.S. Cl.
CPC .... *G06K 19/07754* (2013.01); *H01L 21/4853* (2013.01); *H01L 21/4857* (2013.01);
(Continued)

(58) Field of Classification Search
CPC .............................................. G06K 19/07754
(Continued)

(56) References Cited

U.S. PATENT DOCUMENTS

| | | | |
|---|---|---|---|
| 5,969,951 A | 10/1999 | Fischer et al. | 361/737 |
| 2010/0245206 A1* | 9/2010 | Mori | H01Q 1/2208 343/873 |

(Continued)

FOREIGN PATENT DOCUMENTS

| | | | |
|---|---|---|---|
| EP | 1 498 843 A2 | 1/2005 | |
| EP | 2 221 751 A1 | 8/2010 | |

(Continued)

*Primary Examiner* — Allyson N Trail
(74) *Attorney, Agent, or Firm* — Harrington & Smith

(57) ABSTRACT

The invention relates to a method for fabricating chip cards. According to this method, an antenna and a chip card module are provided. This chip card module includes a dielectric substrate and conducting tracks at least on a face of this substrate. A connection unit is used to establish a connection between the antenna and conducting tracks of the module. The invention also relates to a method for fabricating an antenna support including such a connection unit. The invention also relates to a chip card and an antenna support which are obtained by the aforementioned methods.

22 Claims, 6 Drawing Sheets

(51) Int. Cl.
*H01L 23/13* (2006.01)
*H01L 23/14* (2006.01)
*H01L 23/498* (2006.01)
*H01L 23/66* (2006.01)

(52) U.S. Cl.
CPC ............ *H01L 23/13* (2013.01); *H01L 23/145* (2013.01); *H01L 23/4985* (2013.01); *H01L 23/49822* (2013.01); *H01L 23/49838* (2013.01); *H01L 23/49855* (2013.01); *H01L 23/66* (2013.01); *H01L 2223/6677* (2013.01)

(58) Field of Classification Search
USPC ........................................................ 235/492
See application file for complete search history.

(56) References Cited

U.S. PATENT DOCUMENTS

2010/0289135 A1* 11/2010 Otremba ............. H01L 23/3121
　　　　　　　　　　　　　　　　　　　　　257/693
2013/0140370 A1* 6/2013 Finn ................ G06K 19/07769
　　　　　　　　　　　　　　　　　　　　　235/492
2015/0294213 A1　10/2015 Ziemkus
2017/0155807 A1* 6/2017 Zhang ............... H01L 27/14618

FOREIGN PATENT DOCUMENTS

EP　　2 296 109 A1　3/2011
FR　　2 863 747 A1　6/2005

* cited by examiner

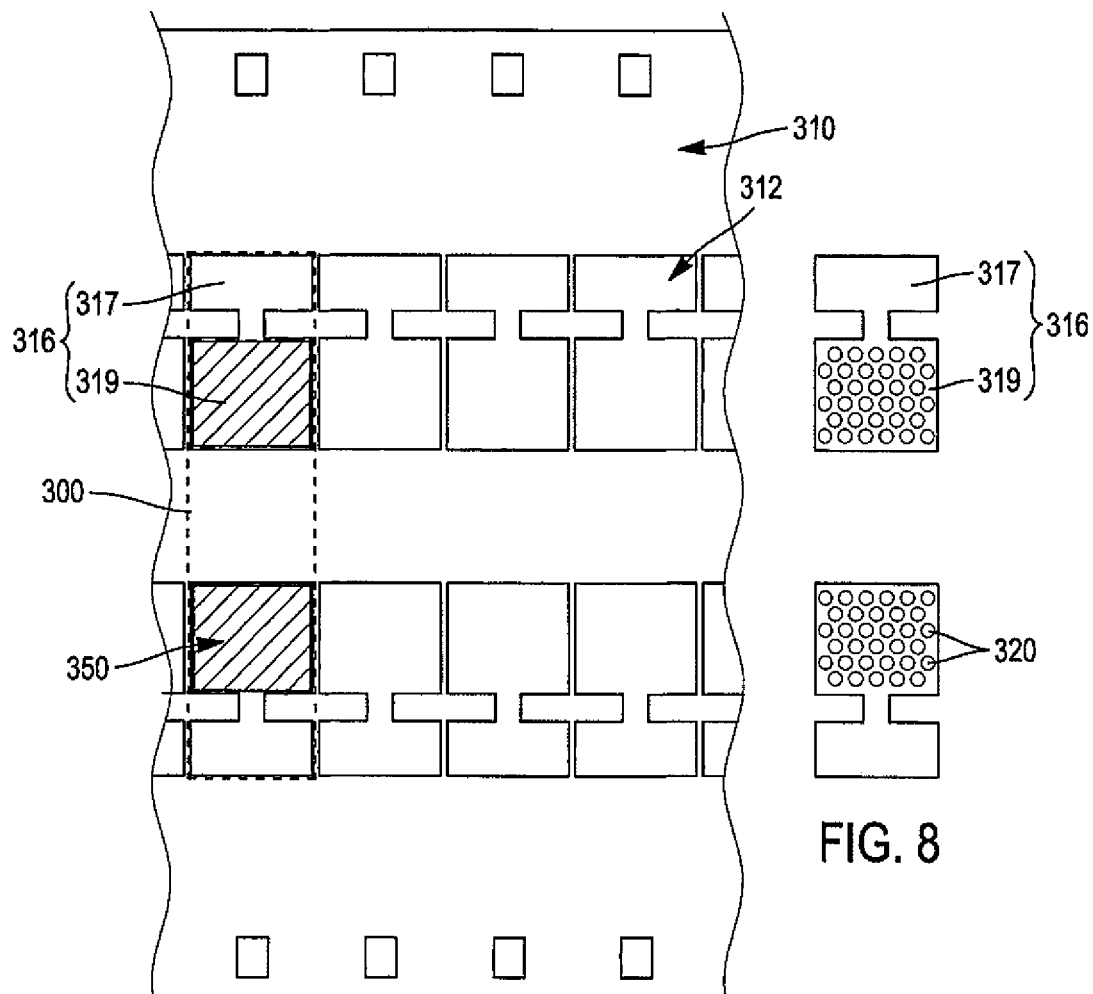
FIG. 8
FIG. 7
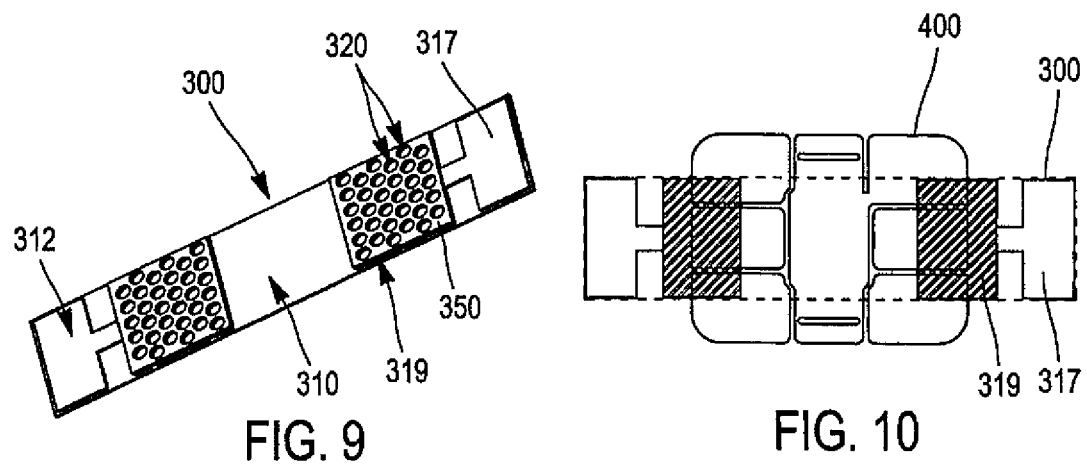
FIG. 9
FIG. 10

METHODS OF FABRICATION OF CHIP CARDS AND OF CHIP CARD ANTENNA SUPPORTS

The invention relates to the field of chip cards. Chip cards are well known to the public, who have many uses for them: payment cards, SIM cards for mobile telephones, transport cards, identity cards, etc.

Chip cards have transmission means for transmitting data from an electronic chip (integrated circuit) to a card-reader device (reading) or from this device to the card (writing). These transmission means may be "contact", "contactless", or else dual-interface when they combine the two preceding means. In particular, the invention makes it possible to produce dual-interface chip cards. Dual-interface chip cards are called "dual" if the "contact" and "contactless" modes are managed by a single chip, or "hybrid" if the "contact" and "contactless" modes are managed by two physically separate chips.

Dual-interface chip cards generally consist of a rigid carrier made of plastic, of PVC, PVC/ABS, PET or polycarbonate type, forming most of the card, into which are incorporated an electronic module and an antenna. The electronic module has a, generally flexible, printed circuit board equipped with an electronic chip and contact lands connected electrically to the chip and exposed to view on the electronic module and on the surface of the carrier that forms the card, for connection by electrical contact with a card-reader device. Dual-interface chip cards furthermore have at least one antenna for transmitting data between a chip and a radiofrequency system, enabling data to be read or written contactlessly.

In the prior art, the electronic module comprising the contacts and the chip, on the one hand, and the antenna possibly integrated into a carrier (inlay), on the other hand, are generally manufactured separately, and then the antenna is connected to the module on which the chip is mounted and connected. The antenna and the module are connected using complex methods that have a negative effect on productivity, manufacturing yield and the reliability of the cards during use thereof.

One aim of the invention is to simplify this type of method and to make the connection between the antenna and the module more reliable.

This aim is achieved at least in part by virtue of a method for manufacturing a chip card comprising:
producing an antenna; the antenna having at least two ends and being intended to be coupled electromagnetically with a contactless card-reader device;
laminating at least two layers of plastic, between which layers the antenna is positioned;
introducing, into a cavity formed in at least one layer of plastic, a chip card module including a substrate; this substrate having a first main face and a second main face, and conductive tracks being arranged at least on the first main face of the substrate. For example, at least one of these conductive tracks is set apart for a temporary electrical connection with a contact card-reader device. In other words, the first face (generally called contact face) includes at least one conductive track forming a contact for establishing a temporary connection with a card-reader device. This track is linked, via one of its faces, electrically and permanently, through a bonding hole (via hole or through hole) to an electronic chip and, via the other of its faces, temporarily, to a contact card-reader device when the card is inserted into this device.

This method furthermore includes
providing a connection unit having a flexible film with a conductive layer on at least one of its main faces, this conductive layer including at least one connection pad itself having a first portion and a second portion that are connected electrically to one another,
connecting one end of the antenna to a first portion of the conductive layer of the connection pad, and
connecting a conductive track of the module, which track is situated on the first face of the substrate of the module, to a second portion of the conductive layer of the connection pad, or else
connecting a conductive track of the module to a second portion of the conductive layer of the connection pad, this second portion having a plurality of perforations.

When the second main face of the module does not have conductive tracks, at least one of the tracks of the first face (but more generally two of these tracks) may be set apart solely for an indirect connection with an antenna (in other words, this track is linked electrically to a chip, on the one hand, and indirectly, via the connection unit, to an antenna, on the other hand). For example, the connection unit is positioned with the antenna, on or in a structure (inlay) between two layers of plastic, before these are laminated.

Using a connection unit has numerous advantages. The connection unit is manufactured independently of the antenna and of the module. It may be manufactured using a reel-to-reel process. It may be used in any antenna and module inlaying method. It makes it possible to easily design and produce modules with six or eight contact lands. It is compatible with numerous antenna formats, in particular the ID1 and 1/2ID1 formats. It enables a reliable connection between the antenna and the module, by virtue of the connection pads that provide portions that are possibly separate and that are set apart specifically for the connection of the antenna and of the module, respectively (the dimensions of these portions may be adjusted to the type of connection: thermocompression, ultrasound, soldering, etc.). It is compatible with wired antennas and with etched antennas in equal measure. The two connection portions are situated on one and the same face of the connection unit, thereby making it possible, easily and continuously, through etching or through leadframe technology, to produce the first and second portions. This connection unit may be used, in particular in combination with the deposition of drops of solder on the second portions, to establish a connection with the rear face of a contact situated on the contact face of the single-face module or with conductive tracks on the rear face of a dual-face module. This connection unit makes it possible to produce connection lands, called "second portions" above, having relatively large dimensions. These connection lands may also be perforated in order to limit the amount of solder material on them and hence reduce the heat input necessary to melt the solder material.

The deposition of solder or brazing material (consisting for example of a tin-bismuth alloy), for example in the form of drops, on the connection pads makes it possible, once the connection unit has been integrated into an antenna carrier, to produce a product (inlay with an antenna) that can be marketed as is, in order to be inlaid into layers of plastic and connected to a module subsequently mounted in the card. This product is ready to use and facilitates the operations of the card manufacturer. Indeed, the card manufacturer now needs only to assemble a number of elements (inlay with an antenna, module and sheets of plastic), which may be supplied separately. The operation of connecting the module to the antenna is greatly simplified by the use of the solder material that is already in position on the connection pads. Furthermore, this operation may take place at the same time as that of fastening or bonding the module in its cavity, either using only the solder material itself or using a bonding material such as a heat-reactivatable adhesive, a single heating operation then being necessary in order both to connect the module to the antenna and to fasten the module in its cavity.

The method according to the invention may possibly include one or other of the features of claims 1 to 11, considered separately or in combination with one or more others.

The method according to the invention may furthermore possibly include one or other of the following features, considered separately or in combination with one or more others:

- in order to facilitate the connection between the antenna and the module, and possibly make said connection more reliable, the solder material deposited on a connection pad of the antenna, before it is heated, protrudes from the internal surface of a cavity produced, for example by milling, in some of the layers of plastic;
- the solder material is formed of a material having a melting point of between 120° C. and 230° C., and more preferably between 130° C. and 150° C.;
- the solder material is heated by applying, to a zone of the module, for example using a thermode, a temperature of between 120° C. and 250° C.;
- the antenna is produced on an antenna carrier, for example by embedding the antenna in an antenna carrier made of plastic; or else the antenna is etched into a layer of conductive material, which layer is colaminated with an antenna carrier made of dielectric material; or else the antenna is produced independently of its carrier before being transferred onto the latter; the antenna carrier, with the antenna, is laminated with the connection unit and at least one layer of plastic so as to directly form a structure corresponding to the chip card or so as to form an intermediate structure (inlay) that is inlaid subsequently;
- the connection unit is produced on a flexible film, that is independent of and possibly of a different nature to the antenna carrier; in other words, the connection unit may be produced, independently of the antenna and of its carrier, as a unit into which at least two connection pads are integrated, each of these connection pads being set apart for a connection to one end of the antenna, respectively, before being transferred, as a single and independent entity comprising at least the two pads for connection to the antenna, onto or into the antenna carrier;
- the antenna carrier includes a PVC substrate;
- the layer(s) of plastic, laminated with the antenna carrier and the connection unit, are made of PVC; and
- in apertures formed in the substrate of the module, from the rear face of a single-face module, a solder alloy is deposited onto the conductive tracks set apart for the connection with the antenna facing the second portions of the conductive layer of the connection unit; solder material is thus present both on the connection unit and on the module.

The method according to the invention, as a whole, may be implemented continuously (reel-to-reel).

According to another aspect, the invention comprises a chip card, for example produced using the method mentioned above, including an antenna and a chip card module. The chip card according to the invention may possibly include one or other of the features of claims 12 to 16, considered separately or in combination with one or more others.

According to another aspect, the invention comprises an antenna carrier for a chip card. This antenna carrier for a chip card includes an antenna enabling electromagnetic coupling with a contactless card-reader device. The antenna has at least two ends. This carrier furthermore comprises a connection unit having a flexible film and a conductive layer on one of the main faces of the flexible film. This conductive layer comprises at least one connection pad having a first portion and a second portion that are connected electrically to one another. The first portion is linked electrically to one of the ends of the antenna. A solder material is deposited on the second portion of the conductive layer, with a thickness suitable for establishing an electrical connection with a conductive track situated on a first main face of a chip card module substrate (this chip card module substrate specifically having a first main face and a second main face), when the module is positioned in a cavity in the chip card, the first face of the substrate having at least one conductive track set apart for an electrical connection with a contact card-reader device, and a second main face of the substrate facing the connection unit.

According to another aspect, the antenna carrier includes a connection unit with a solder material deposited on the second portion of the conductive layer and with a thickness suitable for establishing an electrical connection with a conductive track situated on either of the main faces of a chip card module substrate, when this module is positioned in a cavity in the chip card into which the antenna carrier is integrated, this second portion having a plurality of perforations.

The antenna carrier may include one or other of the features of claims 19 to 21, considered separately or in combination with one or more others.

The antenna carrier may furthermore include one or other of the following features, considered separately or in combination with one or more others:

- the solder material is formed of an alloy having a reflow point of less than, equal to or close to 200° C.; for example, it is a tin or indium alloy; more particularly, it may be an alloy contained in the list formed of tin-bismuth alloys, tin, bismuth and silver (SnBiAg) alloys, tin, bismuth and nickel (SnBiNi) alloys, indium and bismuth (InBi) alloys; and
- it includes a PVC substrate.

According to yet another aspect, the invention comprises a method for manufacturing such an antenna carrier, wherein a connection unit is laminated with a layer of plastic on which an antenna is resting.

Other features and advantages of the invention will become apparent upon reading the detailed description and the appended drawings, in which:

FIG. 7 is a schematic depiction, seen from above, of a plurality of connection units corresponding to another embodiment, these connection units still being together on the film on which they were produced;

FIG. 8 is a schematic depiction, seen from above, of the connection pads of a variant of a connection unit such as those shown in FIG. 7, or even of one of the units shown in FIG. 7 at a later step of its manufacturing method;

FIG. 9 is a schematic depiction in perspective of a connection unit corresponding to the connection pads of FIG. 8 after it has been individualized;

FIG. 10 is a schematic depiction of an example of the positioning of a chip card module with respect to the connection pads of a connection unit, such as those shown in FIGS. 7 to 9;

Figure 19:
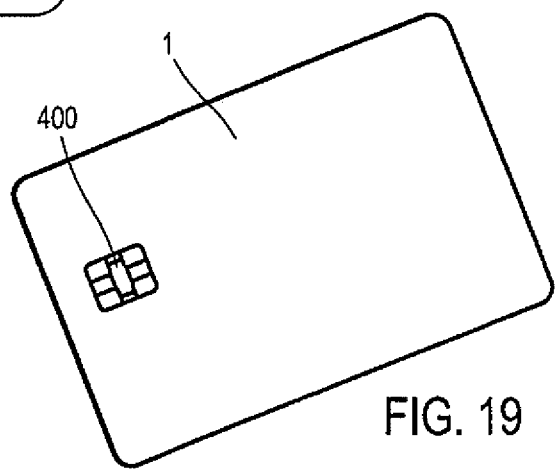
FIG. 19 is a schematic depiction in perspective of an example of a chip card according to the invention after the introduction of a module into a cavity such as the one shown in FIG. 18.
Figure 20:
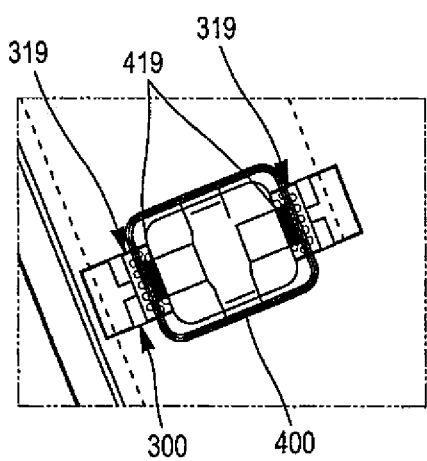
Figure 21:
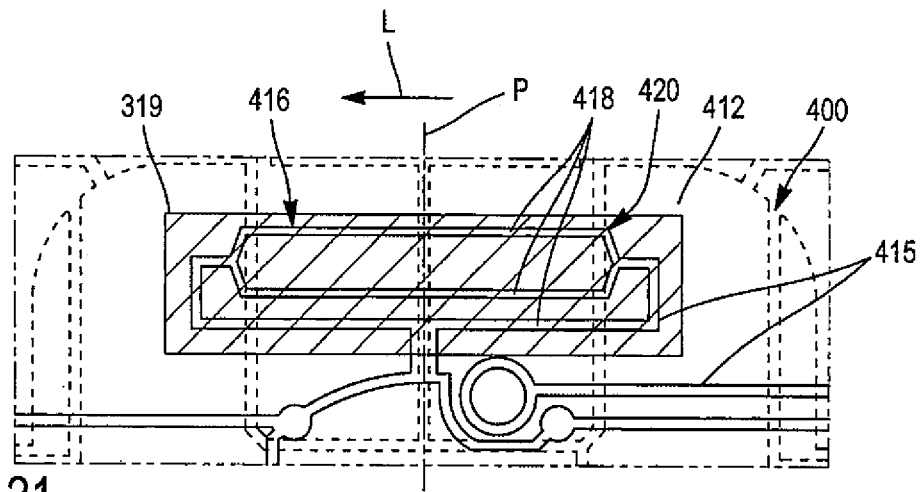
Figure 22:
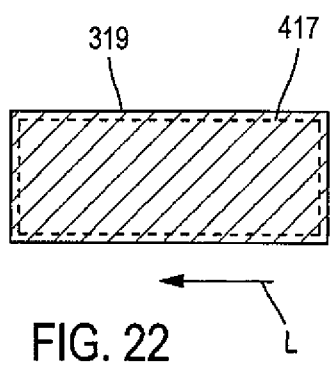
Figure 24:
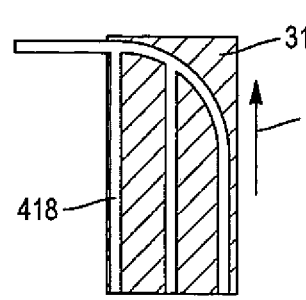
Figure 25:
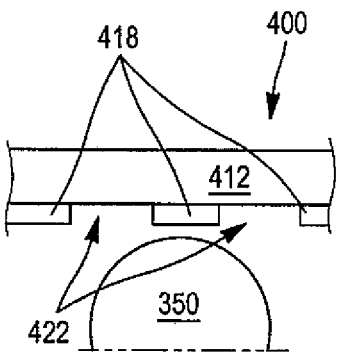
Figure 23:
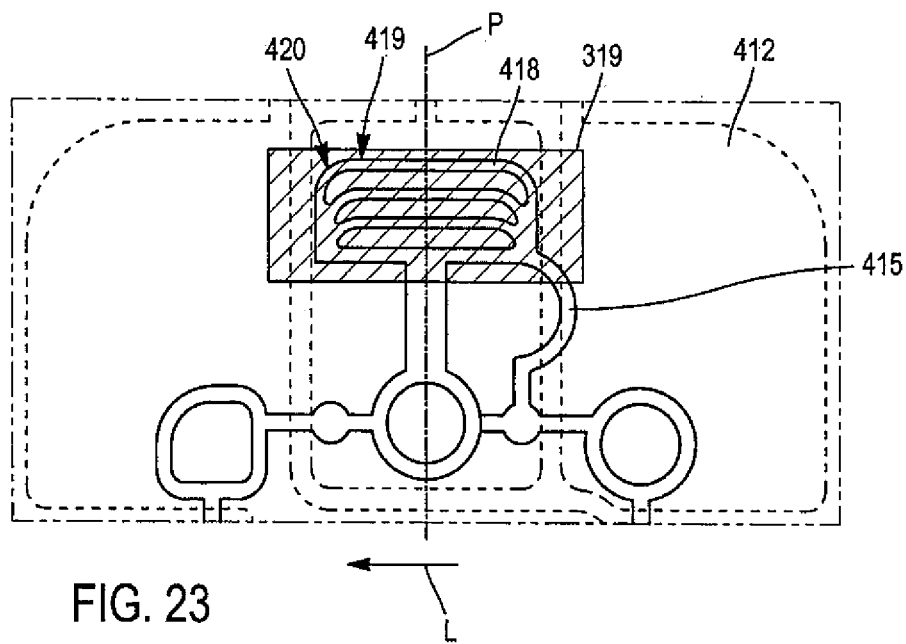

FIG. 20 corresponds to an enlargement of the zone of the module of the card shown in FIG. 19, with the connection pads of the connection unit of FIG. 8 shown transparently;

FIG. 21 is a schematic elevated depiction, seen from its rear face, of a portion of an exemplary embodiment of a module;

FIG. 22 is a schematic depiction of the relationship between the respective areas of the portions of the connection lands covered with the solder material, on the one hand, and of the second portions of the connection pads, on the other hand;

FIG. 23 is a schematic elevated depiction, seen from its rear face, of a portion of another exemplary embodiment of a module according to the invention;

FIG. 24 is a schematic depiction of the relationship between the respective areas of the portions of the connection lands covered with the solder material, on the one hand, and of the second portions of the connection pads, on the other hand; and FIG. 25 is a schematic and cross-sectional depiction of a portion of a connection pad facing a drop of solder material.

In the figures, the same references denote identical or similar elements.

In this document, the terms "front", "rear", "above", "below", "upper", "lower", etc. are purely conventional and make reference, where applicable, to the orientations as shown in the figures.

Figure 1:
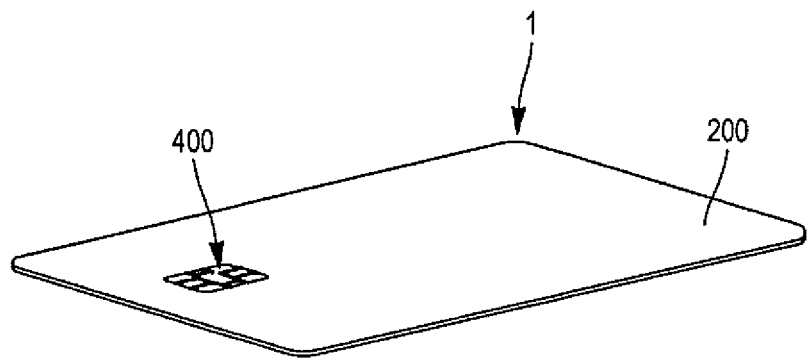
FIG. 1 is a schematic depiction in perspective of a chip card according to the invention.

According to one embodiment of a chip card 1 shown in FIG. 1, said chip card includes a module 400 and a multi-layer complex 200.

The multilayer complex 200 is formed for example of various layers of plastic, such as (from the bottom up in FIG. 2):
a lower layer 205,
an antenna carrier 210, and
an upper layer 220.

The lower layer 205 is for example a layer for finishing (printing for example) and protecting the card 1. Said layer is situated below an antenna carrier 210. The thickness of this lower layer 205 made of PVC is for example a thickness of 0.20 mm before lamination and a thickness of 0.18 mm after lamination. This lower layer 205 has a uniform thickness and does not include a cutout intended to form a cavity for receiving a module.

The antenna carrier 210 has a substrate 212 made of PVC with a thickness of 0.43 mm before lamination and a thickness of 0.40 mm after lamination. A wired antenna 214 for example is deposited and fastened to the substrate 212 (for example embedded, using the technique termed wire embedding). This antenna is formed of a plurality of wound turns and terminates at two ends 216, 218.

Figure 3:
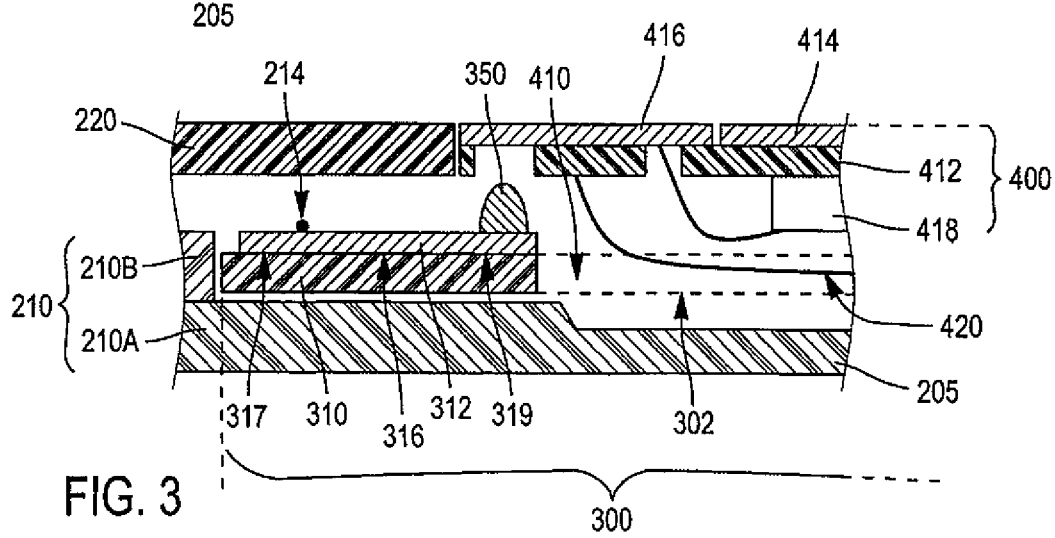
FIG. 3 is a schematic, enlarged, cross-sectional depiction of a portion of the stack shown in FIG. 2.

It will be noted that the antenna carrier 210 may be formed of at least two sub-layers 210A, 210B (see FIG. 3). In this case, the antenna 214 is essentially inserted for example between the bottom layer 210A and the top layer 210B, and the top layer includes a cutout for receiving a connection unit 300 at which the ends 216, 218 of the antenna 214 are connected (in this case, at a connection unit 300, the ends 216, 218 of the antenna 214 are therefore not inserted between the bottom layer 210A and the top layer 210B).

The connection unit 300 has a flexible film comprising a substrate 310 with a first main face and a second main face (see also FIG. 3). A conductive layer 312 is colaminated on one of these main faces. The substrate 310 is for example formed of FR4 or GEP (glass epoxy) material, with a thickness of 0.075 mm (and more generally less than or equal to 0.1 mm). The conductive layer 312 is for example formed of a copper alloy in sheet form with a thickness of 0.03 mm. The flexible film is therefore of copper-clad type, for example.

The connection unit 300 has, for example, a length of 18 mm and a width of 4.5 mm. An aperture 302 of 8 mm by 4 mm, for example, is cut out substantially in the middle of the connection unit 300. The connection unit 300 has two connection pads 316. Each connection pad 316 has a first portion 317 and a second portion 319, these being connected electrically to one another (see also FIG. 4). The first portion 317 is essentially in the shape of a rectangle. The second portion 319 is in the shape of a U extending around the apertures 302, with the base of the U linked (connected) essentially to the middle of the first portion 317 viewed in its longitudinal direction. According to one variant, each connection pad is in the shape of an "H", with each of the parallel branches of the "H" corresponding to a first portion 317 or a second portion 319, respectively, of the metalized zone, these first and second portions 317 and 319 being connected by the center branch. One exemplary embodiment of this variant is described further on with reference to FIGS. 7 to 10. Yet other variants may be envisioned for producing the connection unit 300. For example, instead of having a single conductive band linking the first portion 317 and the second portion 319 (such as the horizontal bar between the two vertical bars of an "H"), the first portion 317 and the second portion 319 may be linked by two or three bands, or even more.

Figure 4:
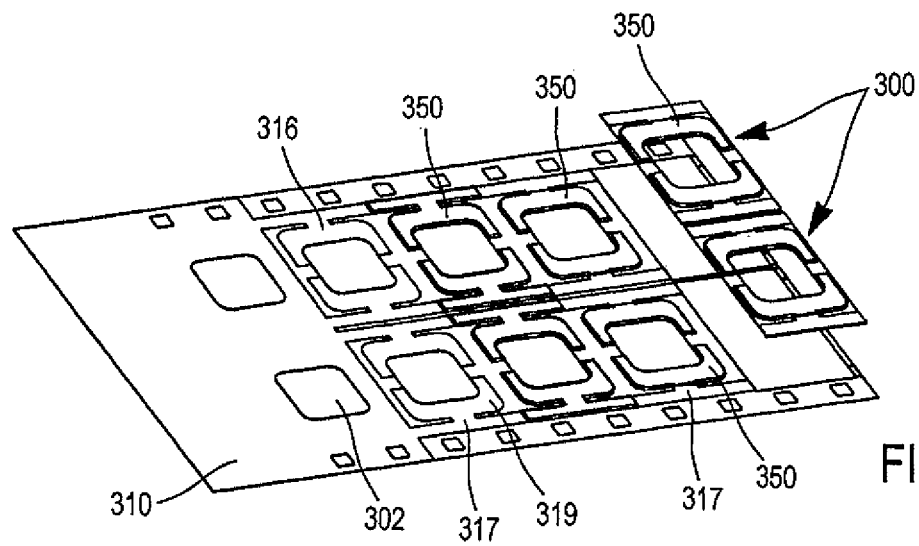
FIG. 4 is a schematic depiction of connection units at various steps of their manufacture, entering into the structure of the stack shown in FIGS. 2 and 3.

As shown in FIG. 4, connection units 300 are produced (for example continuously, reel-to-reel) from a flexible film. The connection units 300 are therefore manufactured independently of the antenna carrier 210 or of the module 400. This flexible film is cut out (for example by punching) so as to form the apertures 302 intended to receive the resin for encapsulating a module 400, as explained further on. Driving notches are also cut out. The conductive layer 312 is then etched (for example using photolithography techniques) so as to form the connection pads 316 (two connection pads 316 per connection unit 300), each respectively with its first portion 317 and second portion 319.

Solder material 350 is then deposited on each of the first and second portions 317 and 319 of the connection pads 316, for example to a thickness of between 0.02 and 0.5 mm, for example. The solder material 350 is then removed from the first portions 317. Finally, the connection units 300 are cut out in order to be individualized. Alternatively, the solder material 350 is deposited in a more selective manner, for example in the form of drops of solder, only on each of the second portions 319 of the connection pads 316. The solder material 350 is deposited on the second portions 319 (but, as indicated above, possibly on the first portions 317 as well) of the conductive layer of the connection pads 316 for example by deposition, by screen-printing or else by wave soldering; this technology makes it possible to deposit solder material 350 to thicknesses of the order of 100 or 200 μm, or even less, and over small areas, such as 3×4 mm$^2$, for example. Each drop of solder material 350, once it has been deposited on a second portion 319 and before the heating operation for carrying out the soldering between the connection unit 300 and the module 400, forms a dome having a height of between 0.02 and 0.5 mm. Advantageously, as is able to be seen in FIG. 3, each drop of solder material 350, before heating, protrudes from the surface of the cavity 410 (or at least protrudes from the upper surface of the upper sub-layer 210B of the antenna carrier, at the location of the cavity 300). Specifically, each drop of solder material 350, over the course of the heating, must come into contact with at least one conductive track 416 that is situated on the face called the "front face" or "contact face" of a module 400. The wettability of the molten solder material 350 may possibly suffice to establish the connection, even in the cases where a drop of solder material 350 would only be flush with the surface of the cavity 410 in which the module 400 is housed. However, insufficient or defective contact caused by insufficient wettability may be avoided by adjusting the height of each drop of solder material 350 in such a way that each drop of solder material 350 protrudes from the surface of the antenna carrier 210. This height may be close to or greater than the thickness of the upper layer(s) 220 of the card 200.

Figure 2:
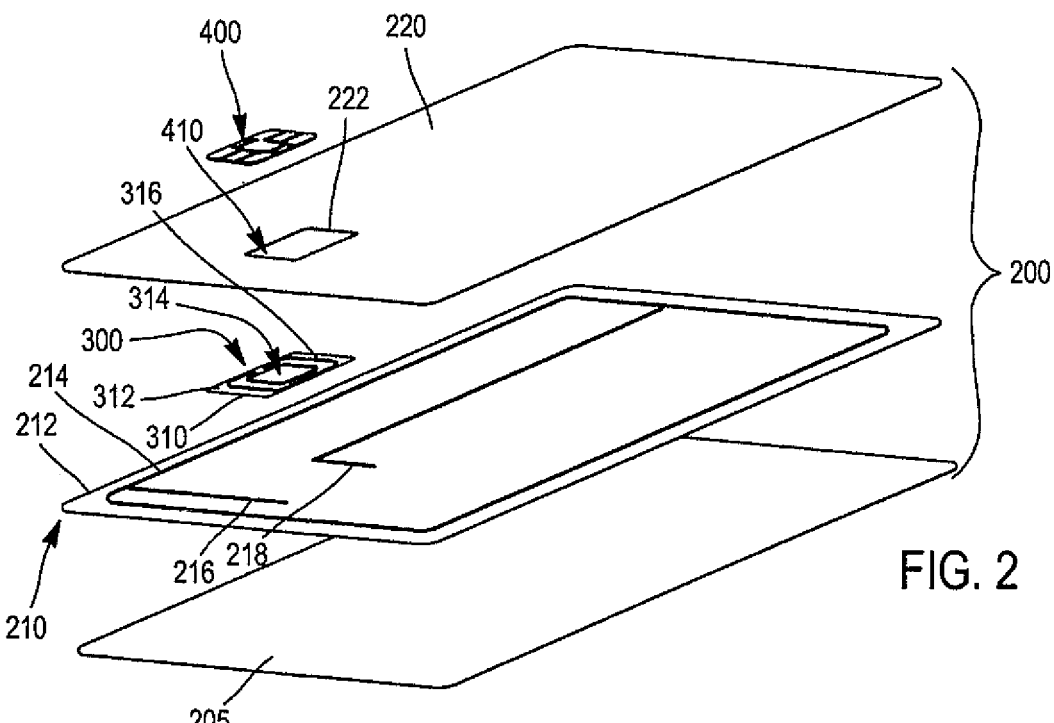
FIG. 2 is a schematic and exploded depiction of an example of a stack of layers forming the chip card shown in FIG. 1.

Returning to the description of the stack of layers of plastic, with reference to FIGS. 2 and 3, the upper finishing and protective layer 220 is also made of PVC, for example. It has a thickness of 0.20 mm before lamination and a thickness of 0.18 mm after lamination. This upper finishing and protective layer 220 includes a cutout 222 corresponding to a cavity 410. Alternatively, rather than forming a cutout 222 in the layer, or the various layers, laminated above the antenna carrier 210, the cavity 410 is milled before the module 400 is connected and fastened in the cavity 410.

The lower layer 205 and the upper layer 220, and also the antenna carrier 210, are not necessarily single-layer. Each of said layers may possibly be formed of one or more layers, all laminated together in the finished card 1.

The total thickness of all of the layers 205, 210, 220, and therefore of the card 1, is substantially 0.8 mm after lamination.

What is termed a "single-face" module 400 is produced, for example in a known manner, on a substrate 412 having conductive tracks 414, 416 on the front face (or "contact face") and an electronic chip 418 on the other (called "rear face" or "bonding face") (see FIG. 3). The electronic chip 418 is fastened on the substrate 412 using at least one known technique, such as die attachment, and is connected electrically to the conductive tracks 414, 416 by at least one known technique, such as flip-chip technology, wire bonding, etc. The chip 418 and its wired connections, if these exist, to the conductive tracks 414, 416 are advantageously protected by encapsulation in a resin 420 (glob top or dam and fill encapsulation, corresponding to a UV or thermal encapsulation). With the chip 418 positioned on the rear face of the substrate 412 or in a cutout produced in the latter, the encapsulation is performed starting from this rear face and may form an excess thickness with respect thereto.

After having positioned (possibly bonded) a connection unit 300 on or in the carrier 210, the ends 216, 218 of the antenna 214 are connected (for example by thermocompression) to the first portions 317 of the connection pads 316. It is therefore observed that the two connection pads 316 of a connection unit 300 are positioned together on or in the carrier 210, during a single operation, corresponding to the introduction of a connection unit 300 (alternatively, each connection pad 316 produced on a portion of connection unit 300 could be individualized by cutting out this portion—with the result that two individualized portions each having one connection pad 316 are obtained—and could be positioned on or in the carrier 210). This assembly, formed of the antenna 214 and of the connection unit 300 on the carrier 210, may be covered with a layer of plastic so as to form an (intermediate) structure that may be sold for lamination with one or more other layers of plastic so as to produce a chip card 1.

According to one mode of implementation of the method according to the invention, the antenna carrier 210 is laminated between layers of plastic (PVC for example) 205, 220 while leaving the cavity 410, in which a module 400 is able to be housed, unobstructed. Each cavity 410 has dimensions such that the connection pads 316 and, above all, its drops of solder material 350 remain accessible. Alternatively, with the upper layer 220 not including a cutout 222, the antenna carrier 210 is laminated between lower and upper layers 205 and 220 with the connection unit 300 being entirely covered (FIG. 5), and then the cavity 410, in which a module 400 is able to be housed, is milled (FIG. 6). According to this embodiment, this milling makes it possible not only to form the cavity 410 such that it accommodates the chip 418 and the encapsulating resin 420, but also to free a portion of each drop of solder material 350 from the plastic forming the layer(s) laminated onto the carrier 210. Specifically, the milling is carried out on at least one portion of the perimeter of the solder material 350 so as to free the solder material 350 from the layers laminated above the carrier 210, and in such a way that the solder material 350 protrudes (before heating) above the surface of the cavity 410 (possibly the cavity such as produced in the carrier 210, without the upper layer). Possibly, during the milling of the cavity 410, a portion of each drop of solder material 350 is removed so as to ensure that the plastic in which the milling is carried out will not prevent the surfaces to be soldered from coming closer to one another or the material forming the melting drops of solder material 350 from wetting the conductive tracks 416. The milling is possibly carried out in a circular manner, all around each drop of solder material 350.

The first portions 317 of the connection pads 316, on which the ends 216, 218 of the antenna 214 have been connected, are situated outside of the milled zone and remain protected by the upper layer 220. Only the second portions 319 of the connection pads 316 covered by the solder material 350, or at least a portion of the surface of said second portions, are accessible in the cavity 410 after milling (see FIG. 6).

When the module 400 is in position in the cavity 410, the solder material 350, arranged on each of the second portions 319 of the connection pads 316, is located facing apertures in the substrate 412, at the level of which apertures the conductive tracks 416 are bare and accessible. The zones of the module 400 located at the level of the drops of solder material 350 are then heated so as to melt the solder material 350 and solder the connection pads 316 to the conductive tracks 416 (this heating operation is possibly performed at the same time as the operation of heating the zones of heat-reactivatable adhesive, which are very close to the drops of solder material, thus making it possible to bond each module in its cavity). It will be noted that the zones of the module 400 located at the level of the drops of solder material 350 correspond to conductive lands 416 underneath which there is no substrate 412. The thermal conduction of the heat supplied by a thermode to the conductive lands 416 is therefore optimized. By choosing a solder material 350 having a melting point of between 120° C. and 230° C., and more preferably between 130° C. and 150° C., it is possible to carry out the operation of heating the solder material 350 by applying, with a thermode for example, to a zone (facing the solder material 350 for example) of the module 400, a temperature of between 120° C. and 250° C.

On account of the thickness of the module 400 and of the height of the dome of a drop of solder material 350, when the solder material melts, it wets the corresponding conductive track 416.

The soldering between the connection pads 316 and the conductive tracks 416 may cover an area of the order of 2 mm², and is such that a pull-off force of the module 400 that is great enough to meet the specifications for this type of product is obtained. The solder material 350 may thus make it possible not only to establish an electrical connection between the conductive tracks 416 and the connection pads 316, but also to fasten the module 400 in the cavity 410 without the aid of an adhesive.

One variant of the embodiment of the connection unit 300 is illustrated in FIG. 7. This variant differs from the one described above with reference to FIGS. 4 to 6 essentially through the area of the first portions 317 and, above all, of the second portions 319. As previously, the connection units 300 are produced (for example continuously, reel-to-reel) from a flexible film, for example of copper-clad type. This flexible film is cut out (for example by punching) so as to form driving notches. The conductive layer 312 is then etched (for example using photolithography techniques) so as to form connection pads 316 (two connection pads 316 per connection unit 300), each respectively with its first portion 317 and second portion 319. The second portions 319 have a larger area than in the case of the embodiment illustrated by FIGS. 4 to 6. For example, they measure around 4.25 mm×4.5 mm, i.e. 19.125 mm². The first portions 317, for their part, measure for example 2.125 mm×4.5 mm, i.e. 9.56 mm².

The relatively large dimensions of the second portions 319 allow greater tolerances with regard to the positioning, facing said second portions, of the conductive tracks of the module 400. A tolerance of more or less 1.5 mm with regard to the positioning of the module 400 in the chip card 1 may be observed. With second portions 319 having a side length of at least 4 mm, sufficient overlap between the zones to be soldered facing one another is ensured. It is possible to observe this relatively large overlap in the example of the positioning of a module 400 with respect to a connection unit 300, illustrated by FIG. 10.

Moreover, the relatively large area of metal covering the connection pads 316 (for example made of copper or of one of its alloys, or of any other appropriate electrically conductive material), in particular at the second portions 319, enables a better dissipation of heat during the heating and soldering operation. The risk of damaging the material(s) forming the layers of plastic that form the finished chip card 1 is thus limited, or even zero. Specifically, better dissipation of heat in the electrically conductive layer 312, and in particular at the second portions 319, makes it possible to compensate at least in part for the fact that, when the substrate 310 of the connection unit 300 is made of glass epoxy, said substrate dissipates relatively little heat. The risk of damaging the visual aspect of the visible external surfaces of the chip card 1 is thus also limited, or even eliminated.

The solder material 350 is deposited in a selective manner only on each of the second portions 319 of the connection pads 316. The solder material 350 is deposited on the second portions 319 of the conductive layer of the connection pads 316 for example by deposition, by screen-printing or else by what is termed "wave soldering" technology.

The solder material 350 occupies an area of around 4.5 mm×3 mm on the surface of the second connection portions 316, to a thickness of between 100 μm and 250 μm, for example close to 150 μm. The solder material 350 is an alloy having a melting point close to or equal to 135° C.

However, these larger areas of the second portions 319 also mean larger areas of solder material 350.

Thus, according to one variant illustrated by FIG. 8, in order to limit the amount of solder material 350, for economic reasons and to limit the amount of heat to be supplied in order to melt the solder material 350, perforations 320 may possibly be formed in the conductive layer, at the second portions 319.

These perforations 320 may be formed in the flexible film at the same time as the driving notches, or in a later step. They are formed by punching, for example. These perforations 320 may be produced in numerous shapes (round, triangular, etc.). For example, when they are round in shape, their diameter may be between 0.1 mm and 1 mm, and advantageously equal to, or close to, 0.5 mm. The perforations may be arranged in quincunx, in columns or rows, etc. They are spaced apart at least by a distance equivalent to their diameter, for example from 0.1 to 1 mm, and advantageously by a distance equal to, or close to, 0.5 mm.

Alternatively, the perforations may have been etched into the conductive layer 312 at the same time as the connection pads 316, for example. Alternatively again, in the context of the implementation of a leadframe technology, the perforations may have been produced in the conductive layer 312 at the same time as the connection pads 316, for example, but before transferal to and lamination on the substrate 310.

In any case, it is preferable (but not essential) to cut out the perforations before depositing the solder material 350 on the second portions 319.

After depositing the solder material 350 on the second portions 319, the connection units 300 are individualized. A individualized connection unit 300 is shown in FIG. 9.

Numerous variants to the embodiments described above may be envisioned. Thus, many types of stack of layers of plastic 205, 210, 220, and also various locations for the connection unit 300 in this stack, may be envisioned.

Figure 11:
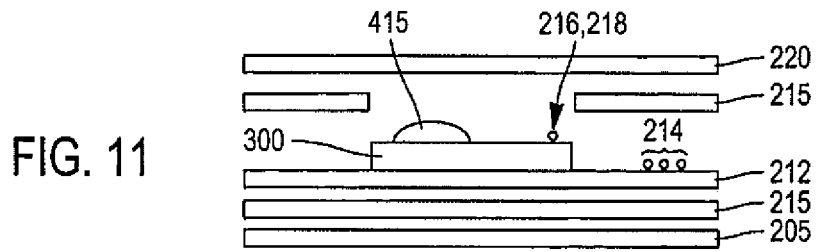
FIGS. 11 to 13 are schematic, exploded, cross-sectional depictions of examples of the arrangement of a connection unit within a set of stacked layers, forming an intermediate structure of inlay type.

FIG. 11 illustrates a stack in which the lower and upper layers 205 and 220 are finishing layers (also called overlays). Intermediate layers 215, for example made of PVC, are located above and below the antenna carrier 212. The antenna carrier 212 includes an antenna 214, one end 216 or 218 of which is connected to a connection unit 300 positioned above the antenna carrier 212. A cutout 222 is formed in an intermediate layer 215 so as to house the connection unit 300 and to form a spacer between the antenna carrier 212 and the upper finishing layer 220. In this example, the antenna is positioned on the surface on the antenna carrier 212 and oriented toward the upper layer 220.

Figure 12:
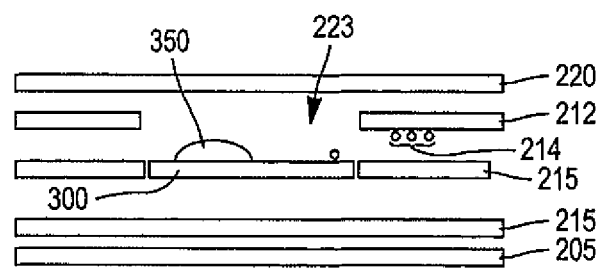

FIG. 12 illustrates a stack that differs from the stack of FIG. 11 essentially in that the antenna carrier 212 is flipped in such a way as to position the antenna on that surface of the antenna carrier 212 that is oriented toward the lower layer 205, in that the antenna carrier 212 includes a cutout 223 that facilitates the exposure of the solder material 350 during the milling operation that consists in forming a cavity in the upper finishing layer 220, and in that the connection unit 300 rests on an intermediate layer 215 instead of the antenna carrier 212.

Figure 13:
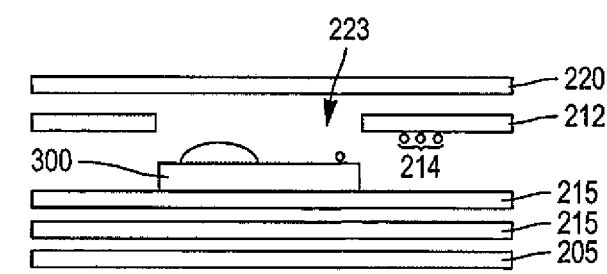

FIG. 13 illustrates a stack that differs from the stack of FIG. 11 essentially in that the antenna carrier 212 is flipped in such a way as to position the antenna on that surface of the antenna carrier 212 that is oriented toward the lower layer 205, in that the antenna carrier 212 includes a cutout 223 that facilitates the exposure of the solder material 350 during the milling operation that consists in forming a cavity in the upper finishing layer 220, and in that the connection unit 300 rests on an intermediate layer 215 instead of the antenna carrier 212.

In any case, it is important to position the connection unit 300 at a height that is as precise as possible in the stack (hence, for example, positioning a second intermediate layer 215 underneath the connection unit 300 in the example illustrated by FIG. 13). The tolerance with regard to this height in the finished card is more or less 30 μm.

Figure 14:
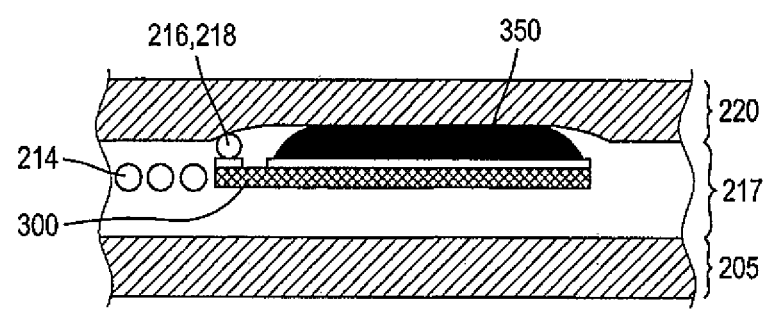
FIGS. 14 and 15 are cross-sectional depictions of a portion of an example of an intermediate structure of inlay type, laminated between two layers of a chip card, respectively before and after milling of a cavity intended to receive a chip card module.
Figure 15:
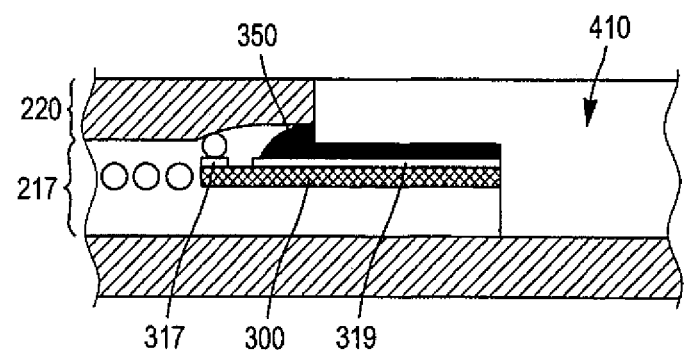

Using the solder material 350 makes it possible to compensate for possible variations in this height. As is able to be seen in FIG. 14, the intermediate structure 217 (inlay) comprising the intermediate layers, the antenna carrier and the connection unit 300 is laminated in sandwich form between the upper and lower finishing layers 220 and 205. The presence of the drop of solder material 350 on the connection unit 300 may deform the layers, and the top of the dome formed by the solder material 350 may be raised with respect to the lower general level of the upper layer 220. When the cavity 410 is milled, the upper layer 220 is removed locally above the solder material 350. As shown schematically in FIG. 15, however, the milling may be carried out in such a way as to remove slightly more than the thickness of the upper finishing layer 220, while retaining enough solder material 350 on the second portions 319 for a subsequent connection to the conductive tracks of a single-face or dual-face module 400.

As already explained, using the connection unit 300 with lands of solder material 350 on second portions of relatively large connection dimensions makes it possible to compensate for possible variations in the positioning of the cavity 410 in the card 1. It may thus be seen, in FIG. 15, that the area of the solder material 350 on the underlying second portions 319 makes it possible to accommodate a certain offsetting of the position of the cavity 410 with respect to the connection unit 300, while retaining enough solder material 350 on the second portions 319 for a subsequent connection to the conductive tracks of a single-face or dual-face module 400.

Numerous other variants to the embodiments described above may be envisioned.

For example, instead of using one of the embodiments of a connection unit 300 described above to form a connection between the antenna 214 and a single-face module 400, it is possible to use it to form a connection between the antenna 214 and a dual-face module 400.

Figure 16A:
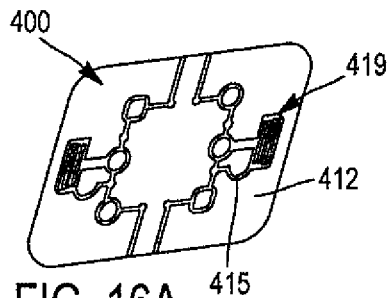
FIGS. 16A and 16B are schematic depictions in perspective, seen from below and from above, respectively, of an example of a dual-face chip card module with six contacts (without the chip, its connecting wires and its encapsulating resin)
Figure 17A:
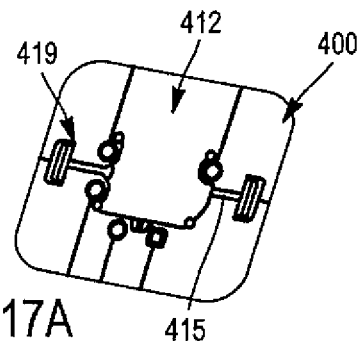
FIGS. 17A and 17B are schematic depictions in perspective, seen from below and from above, respectively, of an example of a dual-face chip card module with eight contacts (without the chip, its connecting wires and its encapsulating resin)
Figure 16B:
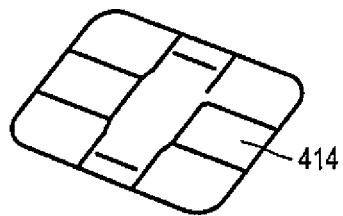
Figure 17B:
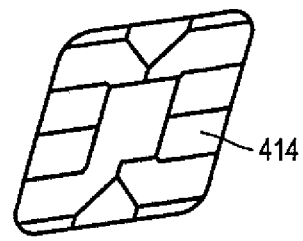

One example of a dual-face module with six contacts (termed "6 pins") is shown in FIGS. 16A and 16B. One example of a dual-face module with eight contacts (termed "8 pins") is shown in FIGS. 17A and 17B. These modules 400, termed "dual-face" modules, with six or eight contacts, are produced for example in a manner that is generally known (apart from the details that will be outlined below, such as the shape of the conductive tracks 415, for example).

In the case of a dual-face module 400, conductive tracks 415, comprising connection pads 419, are located on the rear face of the substrate 412.

Figure 18:
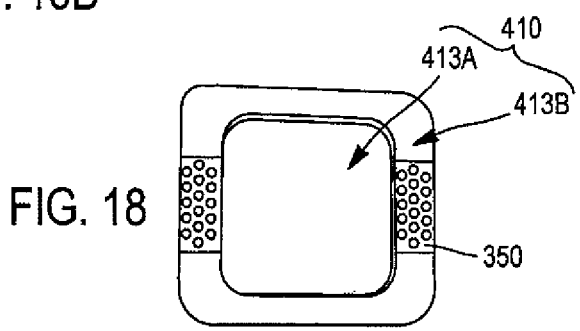
FIG. 18 is a schematic depiction in perspective of an example of a cavity produced in a chip card and intended to receive a module such as the one shown in FIGS. 16A to 17B.

FIG. 18 shows a portion of card in which a cavity 410 has been milled. This cavity 410 has two depth levels. The deepest level corresponds to the central part 413A, and makes it possible to accommodate a resin for encapsulating a chip and its connections. The slightly shallower portion, corresponding to the peripheral portion 413B, forms a seat at which the solder material 350 situated on the second portions 319 has been exposed during the milling of the cavity 410. FIG. 19 shows a module 400 that has been transferred, positioned and fastened in the cavity 410. When a module 400 such as those shown in FIGS. 16A, 16B, 17A and 17B is transferred, the connection pads 419 are positioned facing the solder material 350 that is exposed on the peripheral portion 413B and on which the module 400 rests at its perimeter. In other words, the connection pads 419 are each respectively located facing a second portion 319 of a connection pad 316 of a connection unit 300. FIG. 20 shows, transparently, how the second portions 319 and the connection pads 419 are positioned, respectively.

Using connection units 300 such as those shown in FIGS. 7 to 10 is particularly beneficial in combination with a dual-face module 400. Specifically, the relatively large area of the second portions 319 and of the solder material 350 covering them makes it possible to use connection pads 419 covering a zone also corresponding to a relatively large area. This advantage is illustrated by the exemplary embodiments shown in FIGS. 21 to 23.

Once the card 1 is finished, the module 400 and the antenna 214 may possibly move slightly with respect to one another when the card 1 is being used, in particular when the card 1 is subjected to twisting. The connection between the antenna 214 and the module 400 may therefore be damaged, or even broken. This problem is at least partially addressed by way of the embodiments exemplified with reference to FIGS. 21 to 23.

As shown in FIGS. 21 and 23, the conductive tracks 415 have connection pads 419. These connection pads 419 are used to solder the second portions 319 of the connection pads 316. The ends 216, 218 of the antenna 214 are thus themselves linked electrically to the first portions 317, linked to the second portions 319, which are themselves soldered to the connection pads 419, which connection pads are linked electrically on the rear face of the module 400 to the chip by the conductive tracks 415.

Figure 5:
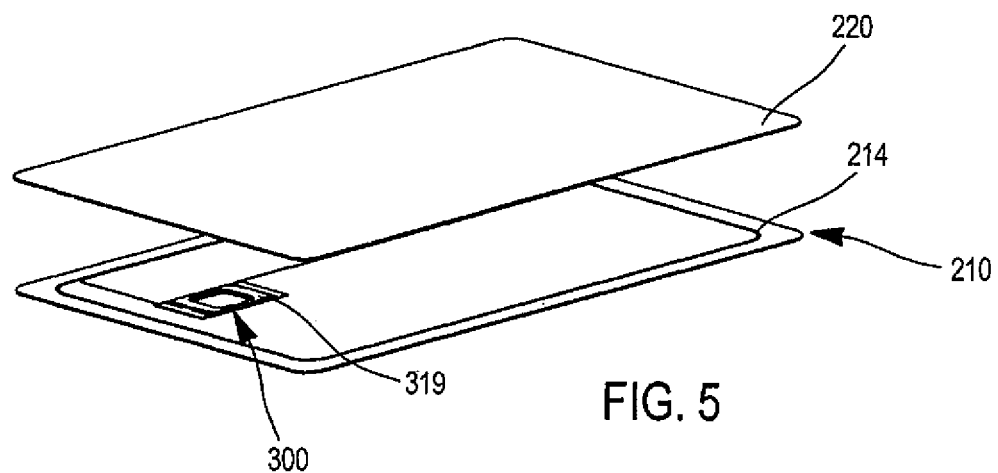
FIG. 5 is a schematic depiction in perspective of a step of the method for manufacturing chip cards according to the invention.
Figure 6:
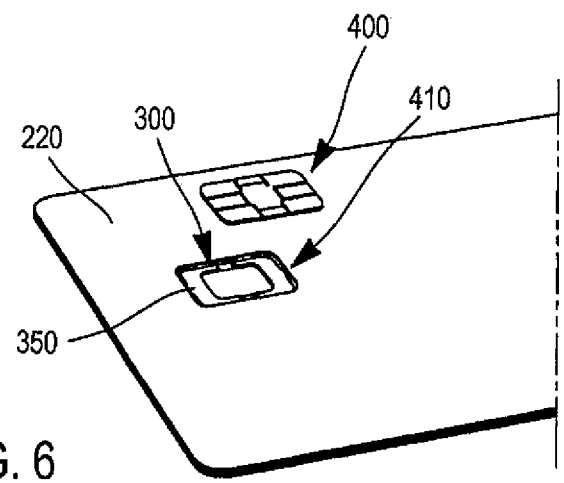
FIG. 6 is a schematic depiction in perspective of another step of the method for manufacturing chip cards according to the invention.

As illustrated schematically by FIG. 22, each connection pad 419 extends in a zone 417 (delineated by dotted lines in FIG. 22) covering an area smaller than that of the second portions 319 (in FIGS. 21 to 24, the second portions 319 are shown in the shape of a hatched rectangle, but they may have other shapes, in particular that of a "U" shown in FIGS. 4 to 6). The zone 417 may be defined as being the one that contains bars 418 and the portions of the conductive tracks that link the bars 418 to one another. The bars 418 are elongated in a direction L essentially perpendicular to the largest side of the module 400, which is generally intended to be parallel with the length of the card 1.

In the embodiment shown in FIG. 21 (which corresponds for example to a module 400 with eight contacts), the bars 418 are three in number.

Each bar 418 is relatively thin, so as possibly to be able to be detached and dismounted from the substrate 412 of the module 400 in order to absorb a large force without breaking. It has a width of between 50 μm and 300 μm, for example. More particularly, it may have a width of close to 100 μm. In this embodiment, the two bars 418 that are furthest from the center of the module 400 have for example a width of 100 μm, and the one closest to the center has a width of 150 μm.

The bars 418 have for example a length of between 1 and 7 mm. The bars 418 shown in FIGS. 21 and 23 are essentially rectilinear, but they could be corrugated, sinusoidal, etc.

So as to be able to absorb the forces in as uniform a manner as possible, the bars 418 are essentially symmetrical about a plane P perpendicular to the substrate of the module 400 and to the longitudinal direction L, and passing through the middle of the module 400.

The bars 418 join up at each of their longitudinal ends and are connected to the conductive tracks 415.

So as to reduce the forces liable to build up at the ends of the bars 418, the ends of said bars terminate with curved portions 420. The radii of curvature of the curved portions make it possible to distribute the forces over a greater length and a greater area.

In the embodiment shown in FIG. 23 (which corresponds for example to a module 400 with six contacts), the bars 418 are four in number and the curved portions 420 of the longitudinal ends of the bars are directed toward the inside of the module 400. In this embodiment, the three bars 418 that are furthest from the center of the module 400 have for example a width of 100 μm, and the one closest to the center has a width of 150 μm. Their length is preferably between 1.5 and 3 mm; for example, said length is 2.5 mm. The curved portions 420 are in the shape of a circular arc having radii of curvature of between 35 μm (at the junction of the ends of the branches 418) and 350 μm (at the rectilinear ends of the branches 418).

One variant of the connection pads 419 described with reference to FIG. 23 is illustrated by FIG. 24. According to this variant, the bars 418 are three in number. The length of the bars 418 increases toward the center of the module 400 (toward the left in FIG. 24). The ends of the bars 418 are linked and connected electrically to one another by curved portions 430 in the shape of a circular arc. Like in the embodiment illustrated by FIG. 23, the area (hatched) of the second portion 319 covered by the solder material 350 covers the entirety of the zone 417 comprising the bars 418 and the curved portions 420. When forces are exerted between the card 1 and the module 400, they tend to build up at the ends of the bars 418 and the curved portions 420. By coating and by sealing the ends of the bars 418 and the curved portions 420 in the solder material, these forces are distributed and dissipated better and in a more uniform manner over the whole surface covered by the solder material 350.

To continue manufacturing the chip card 1, the module 400 is introduced into the cavity 410, with the solder material 350, arranged on each of the second portions 319 of the connection lands 316, facing the connection pads 419.

The zones of the module 400 located at the level of the drops of solder material 350 are then heated, for example using a thermode, like in the embodiments described above.

Moreover, as shown in FIG. 25, the spaces between the bars 418 form recesses 422 that are delineated by the sides corresponding to the thickness of the bars 418, on the one hand, and by the substrate 412 of the module 400, on the other hand. These recesses 422 make it possible to channel the solder material 350 and to prevent it from spreading substantially outside of the zone 417 in which a connection pad 419 is inscribed.

The soldering between the connection lands 316 and the connection pads 416 may possibly cover an area at least of the order of 2 mm$^2$, and is such that a pull-off force of the module 400 that is great enough to meet the specifications for this type of product is obtained. The solder material 350 may thus make it possible not only to establish an electrical connection between the connection pads 419 and the connection lands 316, but also to fasten the module 400 in the cavity 410 without the aid of an adhesive.

In the above, a description has been given of a structure of a chip card 1 in which a connection unit is used to make the connection between the antenna 214 and the module 400. However, the invention also applies to a structure in which an antenna and connection lands are located on one and the same substrate (for example the antenna and the connection lands are etched onto one and the same substrate, which then forms an antenna carrier 210).

We claim:

1. A method for manufacturing a chip card, comprising:
   producing an antenna for electromagnetic coupling with a contactless card-reader device, the antenna having at least two ends,
   laminating at least two layers of plastic, between which layers the antenna is positioned,
   introducing, into a cavity formed in at least one of the layers of plastic, a chip card module including a substrate having a first main face and a second main face, with conductive tracks at least on the first main face of the substrate, this first face of the substrate having at least one of the conductive tracks set apart for a temporary electrical connection with a contact card-reader device,
   providing a connection unit having a flexible film with a conductive layer on at least one of its main faces, this conductive layer including at least one connection pad having a first portion and a second portion that are connected electrically to one another,
   connecting one of the ends of the antenna to the first portion of the connection pad, and connecting at least one of the conductive tracks of the module, which track is situated on the first face of the substrate of the module, to the second portion of the connection pad.

2. The method as claimed in claim 1, wherein the antenna is produced on a carrier and the connection unit is produced on a flexible film that is independent of the antenna carrier.

3. The method as claimed in claim 1, wherein a solder material is deposited on the second portion of the conductive layer of a connection pad in order to connect one end of the antenna to the module.

4. The method as claimed in claim 3, wherein, once the module is in position in the cavity, the solder material deposited on the second portion of the conductive layer of the connection pad is heated so as to solder at least one of the conductive tracks of the module, which track is set apart for an antenna connection, to a connection pad.

5. The method as claimed in claim 3, wherein the solder material is deposited on the second portion of the conductive layer by what is termed wave soldering technology.

6. The method as claimed in claim 3, wherein the conductive tracks include at least one connection pad each covering a zone having an area smaller than that of a connection portion covered with the solder material.

7. The method as claimed in claim 1, wherein the conductive tracks include at least one connection pad having at least two bars linked electrically by their longitudinal ends, at least one of these bars having ends that are curved toward the inside of the module.

8. The method as claimed in claim 1, wherein, apertures formed in the substrate of the module, a solder alloy is deposited onto the conductive tracks set apart for the connection with the antenna facing the second portions of the conductive layer of the connection unit.

9. The method as claimed in claim 1, wherein the connection unit is arranged in a cutout formed in at least one of the layers of plastic.

10. A method for manufacturing a chip card, comprising:
producing an antenna for electromagnetic coupling with a contactless card-reader device, the antenna having at least two ends,
laminating at least two layers of plastic, between which layers the antenna is positioned,
introducing, into a cavity formed in at least one of the layers of plastic, a chip card module including a substrate having a first main face and a second main face, with conductive tracks on at least the first main face of the substrate, this first face of the substrate having at least one of the conductive tracks set apart for a temporary electrical connection with a contact card-reader device,
providing a connection unit having a flexible film with a conductive layer on at least one of its main faces, this conductive layer including at least one connection pad having a first portion and a second portion that are connected electrically to one another,
connecting one of the ends of the antenna to the first portion of the connection pad, and
connecting at least one of the conductive tracks of the module to the second portion of the connection pad, this second portion having a plurality of perforations.

11. The method as claimed in claim 10, comprising connecting at least one of the conductive tracks of the module, which track is situated on the second face of the substrate of the module, to the second portion of the connection pad.

12. A chip card comprising:
an antenna having at least two ends,
at least two layers of plastic, between which layers the antenna is positioned,
a chip card module including a substrate having a first main face and a second main face, with conductive tracks at least on the first face of the substrate, this first face of the substrate having at least one of the conductive track set apart for an electrical connection with a contact card-reader device, wherein the module is housed in a cavity formed in at least one of the layers of plastic,
a connection unit comprising a flexible film with a conductive layer on one of its main faces, this conductive layer including at least one connection pad having a first portion and a second portion that are connected electrically to one another, one of the ends of the antenna being linked electrically to the first portion of the connection pad and at least one of the conductive tracks of the module, which track is situated on the first face of the substrate of the module, being linked electrically to the second portion of the connection pad.

13. The chip card as claimed in claim 12, wherein the antenna is positioned on a carrier and the connection unit has a flexible film that is independent of the antenna carrier.

14. The chip card as claimed in claim 12, wherein the second connection portions are covered with a solder material and the module includes, on the first face of the substrate, contacts, and, on the second face of the substrate, connection pads each covering a zone having an area smaller than that of a connection portion covered with the solder material.

15. A chip card comprising:
an antenna having at least two ends,
at least two layers of plastic, between which layers the antenna is positioned,
a chip card module including a substrate having a first main face and a second main face, with conductive tracks at least on the first face of the substrate, this first face of the substrate having at least one of the conductive tracks set apart for an electrical connection with a contact card-reader device, wherein the module is housed in a cavity formed in at least one of the layers of plastic,
a connection unit comprising a flexible film with a conductive layer on one of its main faces, this conductive layer including at least one connection pad having a first portion and a second portion that are connected electrically to one another, one of the ends of the antenna being linked electrically to the first portion of the connection pad and at least one of the conductive tracks of the module being linked electrically to the second portion of the connection pad, this second portion having a plurality of perforations.

16. The chip card as claimed in claim 15, wherein at least one of the conductive tracks of the module, which track is situated on the second face of the substrate of the module, is connected to the second portion of the connection pad.

17. An antenna carrier for a chip card, comprising:
an antenna configured to enable electromagnetic coupling with a contactless card-reader device, the antenna having at least two ends,
a connection unit having a flexible film and a conductive layer on one of the main faces of the flexible film, this conductive layer comprising at least one connection pad having a first portion and a second portion that are connected electrically to one another, the first portion being linked electrically to one of the ends of the antenna, and a solder material deposited on the second portion of the conductive layer, with a thickness suitable for establishing an electrical connection with a conductive track situated on a first main face of a chip card module substrate, when the module is positioned in a cavity in the chip card, the first face of the substrate having at least one of the conductive track set apart for an electrical connection with a contact card-reader device, and a second main face of the substrate facing the connection unit.

18. The antenna carrier as claimed in claim 17, wherein the solder material deposited on the second portion of the conductive layer of the connection unit has a thickness of between 0.02 and 0.5 mm.

19. The antenna carrier as claimed in claim 17, comprising a plurality of layers of plastic laminated together, and wherein the connection unit is arranged in a cutout formed in at least one of the layers of plastic.

20. The antenna carrier as claimed in claim 17, wherein the solder material is formed of an alloy having a reflow point of less than or equal to 200° C.

21. A method for manufacturing an antenna carrier as claimed in claim 17, wherein a connection unit is laminated with a layer of plastic on which an antenna is resting.

22. An antenna carrier for a chip card, comprising:

an antenna configured to enable electromagnetic coupling with a contactless card-reader device, the antenna having at least two ends, a connection unit having a flexible film and a conductive layer on one of the main faces of the flexible film, this conductive layer comprising at least one connection pad having a first portion and a second portion that are connected electrically to one another, the first portion being linked electrically to one of the ends of the antenna, and a deposited solder material with a thickness suitable for establishing an electrical connection with a conductive track situated on either of the main faces of a chip card module substrate, when the module is positioned in a cavity in the chip card, on the second portion of the conductive layer, this second portion having a plurality of perforations.

* * * * *